(12) United States Patent
Wang

(10) Patent No.: US 11,673,797 B2
(45) Date of Patent: Jun. 13, 2023

(54) MICROSTRUCTURE AND METHOD FOR MANUFACTURING SAME

(71) Applicant: Shanghai Industrial μTechnology Research Institute, Shanghai (CN)

(72) Inventor: Shinan Wang, Shanghai (CN)

(73) Assignee: SHANGHAI INDUSTRIAL UTECHNOLOGY RESEARCH INSTITUTE, Shanghai (CN)

(*) Notice: Subject to any disclaimer, the term of this patent is extended or adjusted under 35 U.S.C. 154(b) by 166 days.

(21) Appl. No.: 17/192,126

(22) Filed: Mar. 4, 2021

(65) Prior Publication Data

US 2021/0284528 A1   Sep. 16, 2021

(30) Foreign Application Priority Data

Mar. 10, 2020   (CN) .......................... 202010163710.1

(51) Int. Cl.
*B81C 1/00*   (2006.01)
*B81B 1/00*   (2006.01)
*G01L 9/00*   (2006.01)

(52) U.S. Cl.
CPC .......... *B81C 1/00047* (2013.01); *B81B 1/002* (2013.01); *G01L 9/0042* (2013.01); *B81B 2201/0264* (2013.01); *B81B 2201/051* (2013.01); *B81B 2203/0315* (2013.01); *B81C 2201/0143* (2013.01); *B81C 2201/0146* (2013.01); *B81C 2201/0181* (2013.01)

(58) Field of Classification Search
None
See application file for complete search history.

(56) References Cited

U.S. PATENT DOCUMENTS

| 6,538,233 B1* | 3/2003 | Lee ..................... B81C 1/00968 |
| | | 219/121.85 |
| 11,065,616 B2* | 7/2021 | Buttner ............... B81C 1/00119 |
| 11,092,977 B1* | 8/2021 | Coleman ................. G02B 3/12 |
| 2016/0220995 A1* | 8/2016 | Atashbar ........... B01L 3/502715 |
| 2018/0214869 A1* | 8/2018 | Earney .................. B33Y 50/02 |

* cited by examiner

*Primary Examiner* — Octavia Davis Hollington
*Assistant Examiner* — Jermaine L Jenkins
(74) *Attorney, Agent, or Firm* — Global IP Services; Tianhua Gu

(57) ABSTRACT

A microstructure and a method for manufacturing the same includes: disposing a liquid film on a surface of a substrate, wherein a solid-liquid interface is formed where the liquid film is in contact with the substrate; and irradiating the substrate with a laser of a predetermined waveband to etch the substrate at the solid-liquid interface, wherein the position where the laser is irradiated on the solid-liquid interface moves at least along a direction parallel to the surface of the substrate, and the absorption rate of the liquid film for the laser is greater than the absorption rate of the substrate for the laser.

11 Claims, 5 Drawing Sheets a)

b)

c)

d)

MICROSTRUCTURE AND METHOD FOR MANUFACTURING SAME

CROSS REFERENCE TO RELATED APPLICATION

The present application claims the benefit of priority to Chinese Patent Application No. CN 2020101637101, entitled "Microstructure and Method for Manufacturing Same", filed with CNIPA on Mar. 10, 2020, the disclosure of which is incorporated herein by reference in its entirety.

FIELD OF TECHNOLOGY

This application generally relates to semiconductors, in particular, to a microstructure and a method for manufacturing the same.

BACKGROUND

Hollow structures are usually required in semiconductor devices, especially in micro electro mechanical system (MEMS) devices. Sometimes, parts of a hollow structure that are neither an entrance nor an exit need to be sealed. Sometimes, a thin film floating above the cavity of the hollow structure is also required.

For example, some pressure sensors require a cavity and a floating film above the hollow. In another example, some microfluidic devices require a microchannel completely sealed except for its inlet and outlet. Liquid is introduced at the inlet, and the liquid is discharged at the outlet. Various purposes such as detection, screening, mixing, and reaction can be achieved in the sealed microchannel. Such a microstructure is usually complex, and cannot be easily implemented through ordinary micromachining technologies.

One prior art solution is to obtain a complex, sometimes sealed, microstructure through first fabricating two or more parts of the microstructure on separate semiconductor substrates and then bonding or gluing the semiconductor substrates together.

SUMMARY

The present disclosure provides a method for manufacturing a microstructure. The method comprises: disposing a liquid film on a surface of a substrate, wherein a solid-liquid interface is formed where the liquid film is in contact with the substrate; and irradiating the substrate with a laser of a predetermined waveband to etch the substrate at the solid-liquid interface, wherein the position where the laser is irradiated on the solid-liquid interface moves at least along a direction parallel to the surface of the substrate, and the absorption rate of the liquid film for the laser is greater than the absorption rate of the substrate for the laser.

The present disclosure also provides a microstructure, wherein the microstructure is manufactured by the processes disclosed herein, wherein the microstructure comprises a substrate, an opening formed on a main surface of the substrate, and a microchannel formed inside the substrate, wherein the microchannel is connected to the opening.

The present disclosure also provides a microfluidic device, wherein the microfluidic device comprises the microstructure mentioned above.

The present disclosure also provides a pressure sensor, comprising the microstructure mentioned above, and a floating structure.

DETAILED DESCRIPTION

Figure 1A:
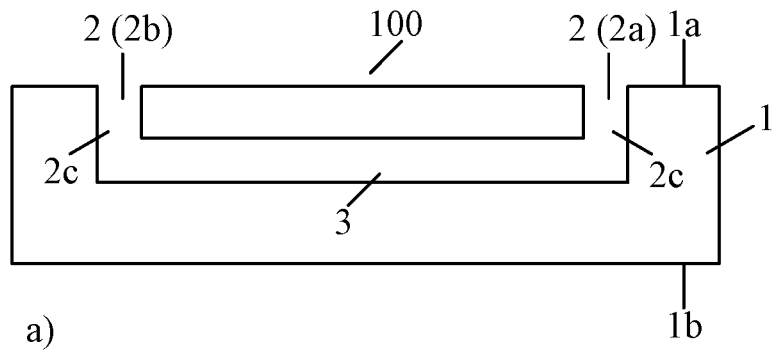
FIGS. 1a-1g are schematic diagrams of microstructures according to some embodiments of the present disclosure.

One or more specific embodiments of the present disclosure will be described below. These described embodiments are only examples of the presently disclosed techniques, and are not intended to limit aspects of the presently disclosed invention. Additionally, in an effort to provide a concise description of these embodiments, all features of an actual implementation may not be described in the specification. It should be appreciated that in the development of any such actual implementation, numerous implementation-specific decisions must be made to achieve the developers' specific goals, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As shown in FIG. 1, the present disclosure provides a microstructure 100, which comprises: a semiconductor substrate 1, openings 2 (for example, the openings 2 may comprise openings 2a and 2b) formed on a main surface 1a of the semiconductor substrate 1, one or more microchannels 3 formed inside the semiconductor substrate 1, and connecting portions 2c that connect the openings 2 and the microchannels 3. The microchannels 3 are sealed inside the semiconductor substrate 1. The openings 2 may also be sealed (see FIG. 1f).

FIG. 1a shows a cross-sectional view of the microstructure 100. The semiconductor substrate 1 may be a silicon wafer, silicon on insulator (SOI) wafer, silicon germanium wafer, germanium wafer, gallium nitride wafer, SiC wafer, or an insulating wafer made of one or more of quartz, sapphire, glass, and the like. In addition, the semiconductor substrate 1 may have various thin films and structures required for semiconductor devices or MEMS devices on a surface of the wafer. In some embodiments, the semiconductor substrate 1 may be made of materials other than semiconductor materials.

Figure 1B:
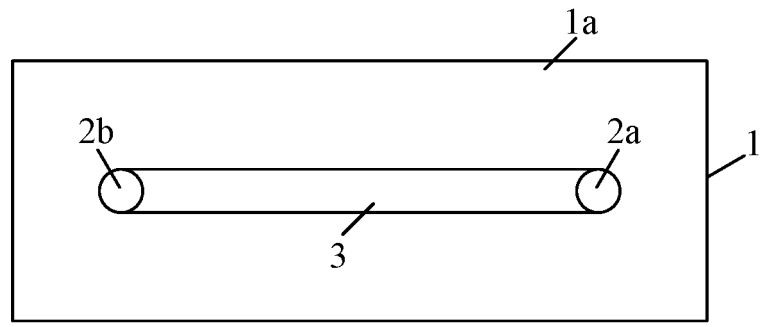
Figure 1C:
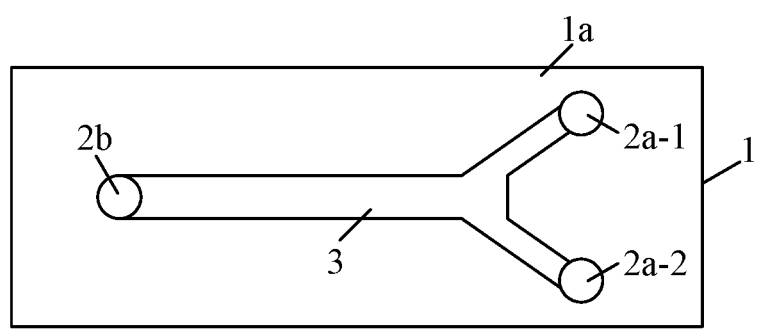
Figure 1D:
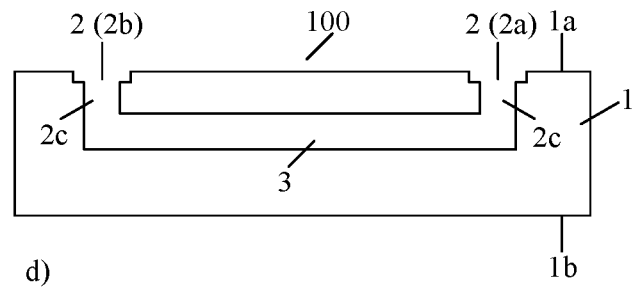

The openings 2 formed on the main surface 1a of the semiconductor substrate 1 define the ends of the microchannels 3. The openings 2 and the microchannels 3 are in connection with each other through the connecting portions 2c. Each of the openings 2 may be in connection with one or more of the microchannels 3; similarly, each of the microchannels 3 may be in communication with one or more of the openings 2. The openings 2 allow substances to be introduced into or out of the microchannels 3. When there is one opening, substances are introduced into or out of the microchannels 3 through that one opening. When each of the microchannels 3 corresponds to more than one of the openings 2, for example, as shown in FIG. 1b, the opening 2 comprises two openings 2a and 2b, and the opening 2a may be used as the entrance and the opening 2b as the exit. In another example, as shown in in FIG. 1c, when the opening 2 comprises more than two openings, for example, three openings 2a-1, 2a-2, and 2b, the openings 2a-1 and 2a-2 may be used as entrances and the opening 2b as the exit, in which case different substances (liquids or gases) can be introduced through the entrances 2a-1 and 2a-2 respectively. As shown in FIG. 1d, in order to facilitate docking with external devices, the sizes of the openings 2 may be different from those of the microchannels 3. In some embodiments, as shown in FIG. 1d, the diameters of the openings 2 are greater than those of the microchannels 3.

The microchannels 3 are formed inside the semiconductor substrate 1. In other words, the microchannels 3 are sealed inside the semiconductor substrate 1. The inner wall of the microchannels 3 is continuous and substantially seamless, and contains no Impurities such as bonding glue. There may be one or more than one microchannels 3. In the microchannels 3, detection, screening, mixing, and reaction of gases, liquids or a combination thereof can be performed. In some embodiments, the inner wall of the microchannels 3 has a protective layer. In some embodiments, the inner wall includes a hydrophilic film; in some embodiments, the inner wall includes a hydrophobic film.

Figure 1E:
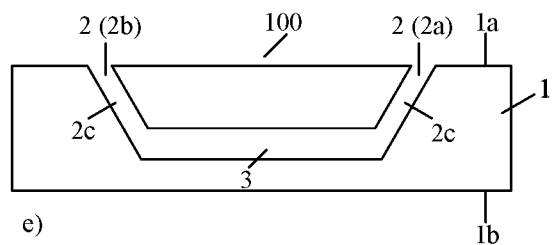

In some embodiments, as shown in FIG. 1a, the connecting portions 2c may be perpendicular or substantially perpendicular to the microchannels 3. In some other embodiments, as shown in FIG. 1e, the connecting portions 2c are not perpendicular to the microchannels 3.

Figure 1F:
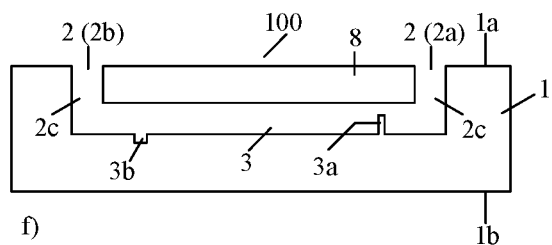

As shown in FIG. 1f, the inner wall of the microchannels 3 may have various microstructures such as a protrusion 3a and/or a recess 3b.

Figure 1G:
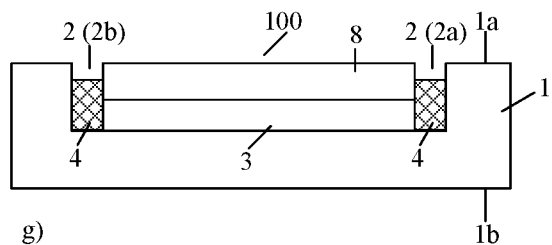

As shown in FIG. 1g, the openings 2 may be sealed. When there is a plurality of openings 2, all or some of the openings may be sealed as needed. For example, as shown in FIG. 1g, the openings 2a and 2b are sealed by a seal 4. After the sealing, the microchannels 3 are isolated from surroundings outside the semiconductor substrate 1.

The microstructure 100 may be applied to a microfluidic device.

The microstructure 100 may also be applied to a pressure sensor. The microchannels 3 may serve as a cavity required for the pressure sensor, and a floating portion 8 of the semiconductor substrate above the microchannels 3 may serve as a floating film required for the pressure sensor.

As described above, in the microstructure, the microchannels (or the cavity) are sealed inside the semiconductor substrate. The microstructure thus has a simple structure, and is easy to manufacture, which reduces manufacturing costs. In addition, in the microstructure there are no components prepared through bonding or gluing. Therefore, there is little to no positional deviation of the microstructure usually caused by bonding or gluing, and there is no foreign matter such as bonding glue in the microchannel. In this way, both dimensional accuracy and performance of the microstructure can be improved.

Figure 3:
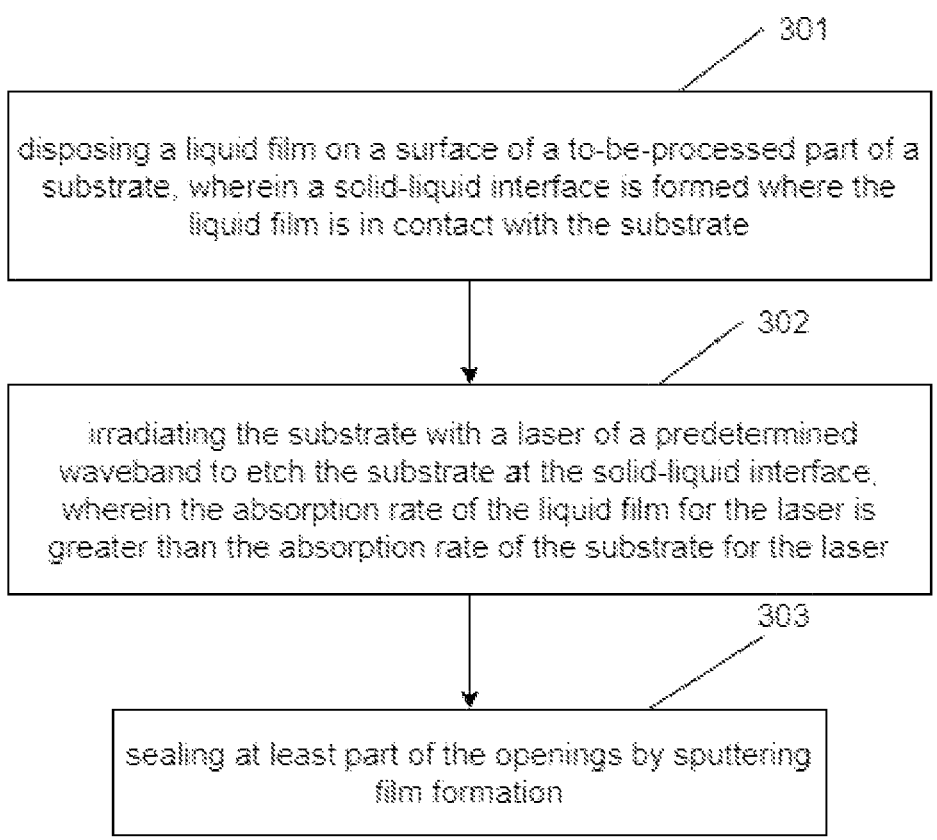
FIG. 3 is a flowchart illustrating a method for manufacturing a microstructure according to some embodiments.

FIG. 3 is a flowchart illustrating a method for manufacturing a microstructure according to some embodiments of the present disclosure. As shown in FIG. 3, the method comprises:

operation 301: disposing a liquid film on a surface of a to-be-processed part of a substrate, wherein a solid-liquid interface is formed where the liquid film is in contact with the substrate; and operation 302: irradiating the substrate with a laser of a predetermined waveband to etch the substrate at the solid-liquid interface, wherein the absorption rate of the liquid film for the laser is greater than the absorption rate of the substrate for the laser.

In one embodiment, the rate of absorption of the substrate for the laser is not greater than 5%, and the rate of absorption of the liquid film for the laser is not less than 10%.

In one embodiment, the laser is a pulsed laser. The liquid film contains a pigment and a solvent, so that the liquid film can partially absorb the laser. When the colour(s) of the pigment change(s), the liquid film can absorb a laser of a different waveband accordingly.

At operation 301, in some embodiments, the liquid film is disposed on a first main surface of the substrate. At operation 302, the laser may irradiate a second main surface of the substrate, and the laser passes through the second main surface of the substrate to irradiate the solid-liquid interface to form an opening on the first main surface of the substrate.

At operation 302, in some embodiments, liquid used to form the liquid film flows through a structure formed through etching, and a new solid-liquid interface is formed when the liquid flows to a new position on the substrate. The position of the laser irradiation can be adjusted to form the microchannels or cavities connected with the openings in the interior of the substrate. For example, the position where the laser is irradiated on the solid-liquid interface moves at least in a direction parallel to the surface of the to-be-processed part of the substrate, thereby forming a transverse microchannel or cavity in the substrate.

As shown in FIG. 3, the method may further comprise an operation 303: sealing at least part of the openings by sputtering film formation.

As described above, the microstructure with microchannels or cavities can be formed inside the substrate, and the method does not adopt bonding or gluing. Therefore, there is little to no positional deviation of the microstructure usually caused by bonding or gluing, and there is no foreign matter such as bonding glue in the microchannel. In this way, both dimensional accuracy and performance of the microstructure can be improved.

The method is also illustrated by FIGS. 2a-2h.

FIGS. 2a-2h show cross-sectional views of various operations of a method for manufacturing a microstructure according to one embodiment.

Figure 2A:
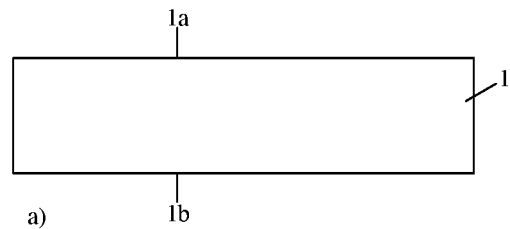
FIGS. 2a-2h show cross-sectional views of various steps of a method for manufacturing a microstructure according to some embodiments.

First, as shown in FIG. 2a, a semiconductor substrate 1 is prepared. For example, the semiconductor substrate 1 is a quartz wafer with a thickness of about 725 microns and a diameter of about 200 millimeters. Other types of wafers may also be used. The semiconductor substrate 1 has two main surfaces 1a and 1b parallel to each other.

Figure 2B:
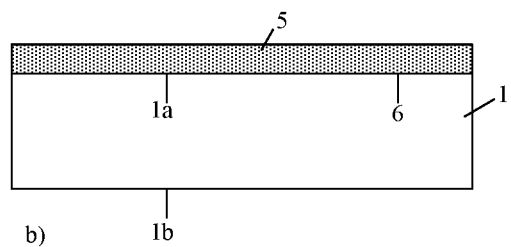

Then, as shown in FIG. 2b, a to-be-processed part on the main surface 1a of the semiconductor substrate 1 is brought into contact with a liquid 5, and a solid-liquid interface 6 is formed where the semiconductor substrate 1 and the liquid 5 are in contact. The liquid 5 may consist of a pigment and a solvent.

Figure 2C:
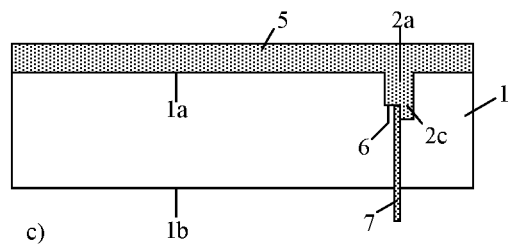

Then, as shown in FIG. 2c, the solid-liquid interface 6 of the to-be-processed semiconductor substrate 1 is irradiated with a laser beam 7, which etches a corresponding part of the semiconductor substrate 1. When the etching of the main surface 1a of the semiconductor substrate 1 starts, the laser beam 7 first irradiates the main surface 1b, which is opposite to the main surface 1a of the semiconductor substrate 1. The laser beam 7 is controlled by a corresponding laser machining system (not shown), and the etching may be performed according to a designed pattern and etching process. A wavelength, energy, a waveform, and the like of the laser beam 7 are selected as needed. The semiconductor substrate 1 is substantially transparent to the laser beam 7. In other words, the laser beam 7 can substantially pass through the inside of the semiconductor substrate 1 without being absorbed. The laser beam 7 may be a pulsed laser beam. For example, when the semiconductor substrate 1 is made of quartz, the laser beam 7 is a nanosecond pulsed laser beam with an ultraviolet wavelength (KrF), and has an energy density of more than 0.1 Joule/cm$^2$. The liquid 5 absorbs energy of the laser beam 7 and generates a high-temperature and high-pressure local shock wave at the solid-liquid interface 6. The local shock wave performs nano-precision bombardment (also referred to as etching) on the surface of the semiconductor substrate 1 at the solid-liquid interface 6 in a nanosecond instant. The part of the semiconductor substrate 1 that is etched away is suspended in the liquid 5 in the form of fine particles, and is taken away and removed through circulation of the liquid 5. In order to achieve an expected etching speed and expected etching accuracy, the component and concentration of the liquid 5 may be optimized. The stronger the ability of the liquid 5 to absorb the energy of the laser beam 7, the faster the micro processing speed. For example, when the laser wavelength of the laser beam 7 is in the visible light range, the liquid 5 may be colored. The liquid 5 may be composed of two or more substances, at least one of which can absorb more than 10% of the laser energy at an adjusted concentration. In some embodiments, the wavelength of the laser beam 7 is about 250 nm, and the liquid 5 is a saturated solution formed by mixing yellow benzopyrene and colorless acetone.

After the surface of the semiconductor substrate 1 at the solid-liquid interface 6 is etched, the liquid 5 automatically flows to the newly formed surface of the semiconductor substrate 1 to form a new solid-liquid interface 6, so that the etching can proceed into the semiconductor substrate 1. By controlling the movement of the laser beam 7 according to the designed pattern and etching process, the opening 2a and the connecting portions 2c can be formed through etching.

Figure 2D:
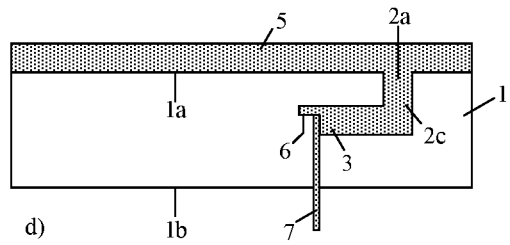
Figure 2E:
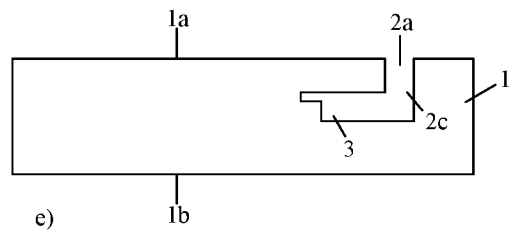

Then, as shown in FIG. 2d, the microchannels 3 are fabricated by processes similar to those described in FIG. 2c. As the processes proceed, new solid-liquid interfaces are consecutively formed, so that the microchannels (or the cavities) 3 can be formed through etching inside the semiconductor substrate 1. As shown in FIG. 2d, the laser etching of the microchannels 3 may occur gradually from a region of the semiconductor substrate 1 close to the main surface 1a and to a region of the semiconductor substrate 1 close to the main surface 1b. For ease of understanding, FIG. 2e shows the substrate 1 in FIG. 2d without the liquid 5. It can be seen that by the above-mentioned method of absorbing laser at the solid-liquid interface 6, not only can micro patterns (such as the opening 2a and the connecting portion 2c) be formed near the surface of the semiconductor substrate 1, but also micro fabrication with high degree of freedom can be performed inside the semiconductor substrate 1, forming microstructures such as the microchannels 3 sealed in the semiconductor substrate 1.

The micro fabrication of the opening 2a and the connecting portions 2c may also be performed by conventional micro fabrication methods. However, it is relatively difficult to fabricate the microchannels 3 by conventional micro fabrication methods.

Figure 2F:
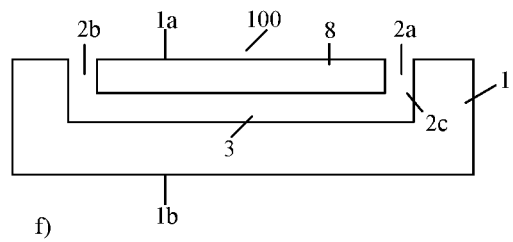

Then, as shown in of FIG. 2f, the laser etching proceeds according to the principle of FIGS. 2c-e, so that the microstructure comprising the opening 2 (comprising openings 2a, 2b), the connecting portions 2c, and the microchannels 3 formed on the semiconductor substrate 1 can be obtained. When necessary, a protective layer (not shown), a hydrophobic film (not shown), or a hydrophilic film (not shown) may be formed on the inner wall of the microchannels 3. For example, an aluminum oxide film may be formed on the inner wall of the microchannels 3 through atomic layer deposition (ALD). In another example, a hydrophobic film (not shown), or a hydrophilic film (not shown) may be formed on the inner wall of the microchannels 3 through a liquid or gaseous film-forming method.

Figure 2G:
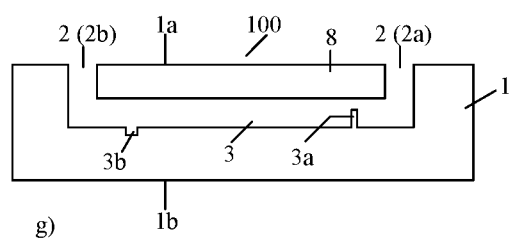

As shown in of FIG. 2g, when needed, various microstructures such as a protrusion 3a, a recess 3b, and the like may be formed on the inner wall of the microchannels 3 separately or simultaneously according to the principle illustrated by FIGS. 2c-f.

Figure 2H:
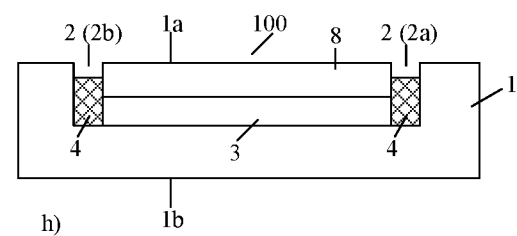

Then, as shown in FIG. 2h, when needed, all or part of the openings 2 may be sealed by the seal 4. The seal 4 may be formed through a semiconductor long film process. For example, the seal 4 may be a thin film formed through sputtering. During formation of the seal 4, part of the thin film may be deposited on a surface (for example, the main surface 1a) of the semiconductor substrate 1. When needed, the thin film deposited on the surface of the semiconductor substrate 1 may be removed through etching, grinding, or the like. When needed, the inside of the sealed microchannels 3 may contain selected substances (solids, liquids, or gases) therein, or may be substantially a vacuum.

Obviously, the above method can be used to obtain a microstructure 100 with a high degree of freedom. For example, each of the openings 2 may correspond to one or more microchannels 3. Similarly, each of the microchannels 3 may correspond to one or more of the openings 2. Shapes and sizes of the openings 2, the connecting portions 2c, and the microchannels 3 may be designed and manufactured with a high degree of freedom. For example, the microstructure 100 may be designed and manufactured in such a way that it can be applied to various microfluidic devices. In another example, the microstructure 100 may also be designed and manufactured to be applied to a pressure sensor. For the pressure sensor, specifically, the microchannels 3 may be a cavity with a designed shape, area, and height, and the floating portion 8 of the semiconductor substrate 1 above the microchannels 3 may be a floating film with a designed shape, area, and height.

As described above, the present disclosure provides the method for forming microchannels (or a cavity) inside a semiconductor substrate, which can be used to obtain a microstructure with a high degree of freedom in shapes and sizes. Such a method has simple procedures, is easy to implement, and can reduce manufacturing costs. In addition, since there is little to no positional deviation of the microstructure usually caused by bonding or gluing, and there is no foreign matter such as bonding glue in the microchannel, both dimensional accuracy and performance of the microstructure can be improved.

While particular elements, embodiments, and applications of the present invention have been shown and described, it is understood that the invention is not limited thereto because modifications may be made by those skilled in the art, particularly in light of the foregoing teaching. It is therefore contemplated by the appended claims to cover such modifications and incorporate those features which come within the spirit and scope of the invention.

What is claimed is:

1. A method for manufacturing a microstructure, comprising:
    disposing a liquid film on a surface of a substrate, wherein a solid-liquid interface is formed where the liquid film is in contact with the substrate; and
    irradiating the substrate with a laser of a predetermined waveband to etch the substrate at the solid-liquid interface, wherein the position where the laser is irradiated on the solid-liquid interface moves at least along a direction parallel to the surface of the substrate, and an absorption rate of the liquid film for the laser is greater than an absorption rate of the substrate for the laser.

2. The method for manufacturing a microstructure according to claim 1, wherein
the rate of absorption of the substrate for the laser is equal to or less than 5%, and
the rate of absorption of the liquid film for the laser is equal to or greater than 10%.

3. The method for manufacturing a microstructure according to claim 1, wherein the laser is a pulsed laser.

4. The method for manufacturing a microstructure according to claim 1, wherein the liquid film contains a pigment and a solvent.

5. The method for manufacturing a microstructure according to claim 1, wherein
the liquid film is disposed on a first main surface of the substrate,
the laser irradiates a second main surface of the substrate, and the laser passes through the second main surface of the substrate to irradiate the solid-liquid interface to form an opening on the first main surface of the substrate.

6. The method for manufacturing a microstructure according to claim 5, wherein liquid used to form the liquid film flows through a structure formed through etching, and a new solid-liquid interface is formed when the liquid flows to a new position on the substrate, and the position of the laser irradiation is adjusted to form a microchannel or cavity inside the substrate, wherein the microchannel or cavity is connected with the opening.

7. The method for manufacturing a microstructure according to claim 5, further comprising:
at least partially sealing the opening through sputtering film formation.

8. A microstructure, wherein the microstructure is manufactured by disposing a liquid film on a surface of a substrate, wherein a solid-liquid interface is formed where the liquid film is in contact with the substrate, and irradiating the substrate with a laser of a predetermined waveband to etch the substrate at the solid-liquid interface, wherein the position where the laser is irradiated on the solid-liquid interface moves at least along a direction parallel to the surface of the substrate, wherein an absorption rate of the liquid film for the laser is greater than the absorption rate of the substrate for the laser, wherein the microstructure comprises a substrate, an opening formed on a main surface of the substrate, and a microchannel formed inside the substrate, wherein the microchannel is connected to the opening.

9. The microstructure according to claim 8, wherein the opening is at least partially sealed.

10. A microfluidic device comprising the microstructure according to claim 8.

11. A pressure sensor comprising the microstructure according to claim 8 and a floating structure, wherein the cavity is formed between the floating structure and the main surface.

* * * * *